United States Patent
Zhong et al.

(10) Patent No.: US 12,445,143 B2
(45) Date of Patent: Oct. 14, 2025

(54) ANALOG-TO-DIGITAL CONVERTER HAVING TIME-CONSTANT TUNING WITH PULSE-WIDTH-BASED REFERENCE CURRENT AND RESISTANCE SEARCHING

(71) Applicant: QUALCOMM Incorporated, San Diego, CA (US)

(72) Inventors: Xiaopeng Zhong, Seattle, WA (US); Yuhua Guo, San Diego, CA (US); Chieh-Yu Hsieh, Irvine, CA (US); Chienchung Yang, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 124 days.

(21) Appl. No.: 18/423,985

(22) Filed: Jan. 26, 2024

(65) Prior Publication Data

US 2025/0247105 A1   Jul. 31, 2025

(51) Int. Cl.
*H03M 1/46* (2006.01)

(52) U.S. Cl.
CPC ........... *H03M 1/466* (2013.01); *H03M 1/462* (2013.01)

(58) Field of Classification Search
CPC .............................. H03M 1/466; H03M 1/462
See application file for complete search history.

(56) References Cited

U.S. PATENT DOCUMENTS

| | | | | |
|---|---|---|---|---|
| 10,157,668 B2* | 12/2018 | Whitaker | ........... | G11C 13/0064 |
| 10,211,844 B1* | 2/2019 | Molev-Shteiman | .. | H03M 1/002 |
| 10,439,572 B1* | 10/2019 | Thompson | ............ | H03M 1/403 |
| 10,666,283 B2* | 5/2020 | Linkewitsch | ....... | H03M 1/1245 |
| 10,686,455 B1* | 6/2020 | Williams | ............... | H03K 5/003 |
| 10,693,486 B1* | 6/2020 | Ko | ........................ | H03K 5/2481 |
| 10,763,875 B2* | 9/2020 | Huang | ................ | H03M 1/0854 |
| 10,972,118 B1* | 4/2021 | Abu Hilal | ............. | H03M 1/363 |
| 10,972,120 B1* | 4/2021 | Abu Hilal | ................ | H03M 1/68 |
| 11,409,045 B2* | 8/2022 | Dorta-Quinones | | ......................... G02B 6/12007 |
| 12,224,765 B1* | 2/2025 | Seow | ..................... | H03M 1/468 |
| 12,316,340 B2* | 5/2025 | Canniff | ................. | H03M 3/464 |
| 2011/0195679 A1* | 8/2011 | Lee | .................. | G01R 31/31718 455/115.1 |

* cited by examiner

*Primary Examiner* — Thomas D Alunkal
(74) *Attorney, Agent, or Firm* — Loza & Loza, LLP

(57) ABSTRACT

A sigma-delta analog-to-digital converter is provided that includes an initial continuous-time integration stage having a variable input resistor and an integration capacitor. A switched-capacitor circuit charges and discharges a replica capacitor to a reference voltage to generate a bias current. A SAR-based tuning circuit includes a variable tuning resistor that generates a tuning voltage while conducting a mirrored version of the bias current. A resistance of the variable input resistor is adjusted responsive to a tuning code from the SAR-based tuning circuit.

20 Claims, 10 Drawing Sheets

ANALOG-TO-DIGITAL CONVERTER HAVING TIME-CONSTANT TUNING WITH PULSE-WIDTH-BASED REFERENCE CURRENT AND RESISTANCE SEARCHING

TECHNICAL FIELD

The present application relates generally to analog-to-digital converters, and more specifically to an analog-to-digital converter having time-constant tuning using a pulse-width-based reference current and resistance searching.

BACKGROUND

Analog-to-digital converters may be classified depending upon the correspondence between input and output samples. In a Nyquist-rate analog-to-digital converter (ADC) there is a one-to-one correspondence between an input sample and the corresponding output sample. In contrast, there is at least a two-to-one correspondence between the input samples and the output samples in an oversampling ADC. Due to matching limitations and other issues, the effective number of bits for Nyquist-rate ADCs is limited as compared to oversampling ADCs. An oversampling ADC such as a sigma-delta (ΣΔ) ADC is thus a popular choice for applications such as microphones that requires a large dynamic range.

SUMMARY

In accordance with an aspect of the disclosure, an analog-to-digital converter is provided that includes: an integrator including a variable input resistor and an integration capacitor; a switched-capacitor bias current generator configured to be clocked by a pair of complementary clock signals to generate a bias current that is proportional to a capacitance of the integration capacitor divided by a pulse width of the complementary clock signals; a current digital-to-analog converter (IDAC) configured to convert a digital output signal from the analog-to-digital converter into an IDAC output current for the integrator that is proportional to the bias current; and a tuning circuit including a variable tuning resistor configured to conduct a mirrored version of the bias current to develop a tuning voltage across the variable tuning resistor, the tuning circuit further including a successive-approximation-register logic circuit configured to vary a resistance of the variable tuning resistor responsive to a tuning code, wherein the integrator is configured to vary a resistance of the variable input resistor responsive to the tuning code.

In accordance with another aspect of the disclosure, a method of tuning an analog-to-digital converter is provided that includes: repeatedly charging to a reference voltage and discharging a replica capacitor having a capacitance that is proportional to a capacitance of an integration capacitor of a continuous-time integration stage of the analog-to-digital converter to generate a bias current; conducting a mirrored version of the bias current through a variable tuning resistor to develop a tuning voltage; digitally varying a resistance of the variable tuning resistor responsive to a tuning code to cause the tuning voltage to be substantially equal to the reference voltage; and varying a resistance of a variable input resistor in the continuous-time integration stage responsive to the tuning code Finally, in accordance with yet another aspect of the disclosure, an analog-to-digital converter is provided that includes: a continuous-time integrator including a variable input resistor coupled to an input terminal of a differential amplifier and including an integration capacitor coupled between the input terminal of the differential amplifier and an output terminal of the differential amplifier; a switched-capacitor circuit configured to generate a bias current that is proportional to a capacitance of the integration capacitor; and a tuning circuit configured to digitally adjust a resistance of a variable resistor according to a tuning code so that a product of the resistance and the bias current equals a reference voltage, wherein the continuous-time integrator is configured to adjust a resistance of the variable input resistor responsive to the tuning code.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

An ADC is disclosed herein in which a first or initial integration stage is a continuous-time integration stage that integrates a difference between a feedback signal and an input signal. A current digital-to-analog converter (IDAC) converts a digital output signal of the ADC to produce an analog current as the feedback signal. To reduce jitter sensitivity, it is advantageous to form the IDAC as a return-to-zero IDAC that pulses the feedback current according to an integration pulse width (Tp) within a cycle of a clock signal. The continuous-time integration is also advantageous with respect to reducing jitter sensitivity. The return-to-zero IDAC pulses the current back to the first integration stage such that a difference (delta) is developed between the feedback current and the input signal. The integration by the first integration stage may also be designated as a summation (sigma) function such that the resulting ADC may be denoted as a sigma-delta ADC.

Figure 1:
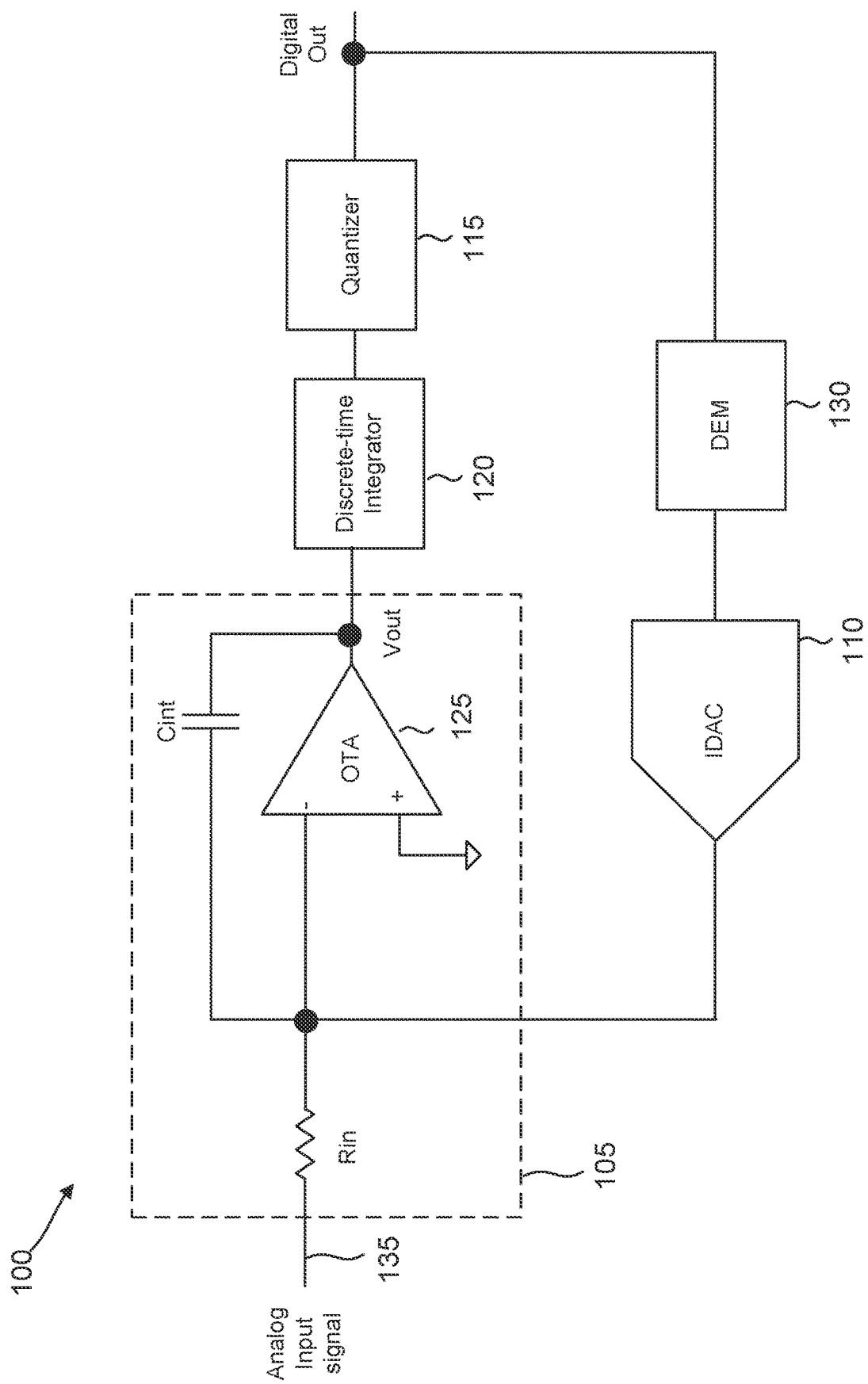
FIG. 1 is a diagram of an example analog-to-digital converter having a time constant tuned in accordance with an aspect of the disclosure.

An example sigma-delta analog-to-digital converter 100 is shown in FIG. 1. A first integration stage 105 is a continuous-time integration stage that integrates according to a resistor-capacitor (RC) time constant. An input resistor Rin functions as the R in the RC time constant. An analog input signal being quantized drives an input terminal 135 of the input resistor whereas another terminal of the input resistor couples to an inverting terminal of a differential amplifier such as an operational transconductance amplifier (OTA) 125. An integration capacitor (Cint) that functions as the C in the RC time constant couples between the inverting terminal of the OTA 125 and an output terminal of the OTA 125. The RC time constant thus equals Rin*Cint, where Rin is the resistance of the input resistor and Cint is the capacitance of the integration capacitor. A current digital-to-analog converter (IDAC) 110 also drives the inverting terminal with a feedback current that is pulsed according to an integration pulse width (Tp) within a cycle of an IDAC clock signal (not illustrated). An optional discrete-time integration stage 120 integrates an output voltage signal (Vout) from the first integration stage 105 to provide an integrated signal that is quantized by a quantizer 115 to provide a digital output signal. After processing by an optional dynamic element matching (DEM) function 130, the digital output signal feeds back through the IDAC to the inverting node of the OTA 125.

It can be shown that the noise transfer function (NTF) of the sigma-delta ADC 100 is proportional to Rin*Cint/Tp and that the signal noise transfer function (STF) is proportional to Rin*Idac, wherein Idac is the IDAC current. It is thus desirable to maintain both Rin*Cint/Tp and Rin*Idac constant despite process, voltage, and temperature (PVT) variations. To do so, it is known to tune a variable integration capacitor using an RC tuning circuit. The RC tuning circuit generates a bias current Ib that is proportional to Vref/((Rin*(Tp/Ts)), where Vref is a reference voltage, Ts is the clock period for the IDAC current pulsing, and Tp/Ts is a predetermined duty cycle of the integration pulse. Each active branch of the IDAC mirrors a copy of the bias current. In addition, the RC tuning circuit includes a tuning capacitor Ctune that has a known capacitance relationship to the integration capacitor that is charged with a mirrored version of the bias current. Based on the charging of the tuning capacitor, the RC tuning circuit generates a tuning code for the tuning of the integration capacitor. However, the resulting RC tuning circuit and the tunable integration capacitor as well as the tuning capacitor demands a relatively large amount of die space on a semiconductor die on which the sigma-delta ADC is integrated. In addition, the NTF and the SFT are then sensitive to a variation of the pulse width Tp.

To address these RC tuning issues, an RC tuning circuit is disclosed in which the input resistor Rin is variable. In addition, a switched-capacitor (SC) bias current generator that generates a bias current (Ib) that biases the RC tuning circuit. Since it generates the bias current, the switched-capacitor bias current generator may also be designated as a bias current switched-capacitor (IBSC) circuit. The RC tuning circuit and IBSC circuit disclosed herein are relatively low power and compact (demanding less die space than a traditional RC tuning circuit approach) and increase the accuracy of the NTF and STF factors. In particular, the NTF is improved since it is no longer sensitive to variations of the pulse width Tp of the IDAC. Similarly, the STF is improved since its sensitivity to the variations of the pulse width Tp is substantially reduced. The RC tuning circuit in conjunction with the IBSC circuit tune both the Rin*Cint/Tp and the Rin*Idac factors discussed earlier. It will thus be appreciated that the sigma-delta ADC 100 is just one example of a sigma-delta ADC that includes an initial continuous-time integration stage and a return-to-zero IDAC that may be tuned as disclosed herein.

Figure 2:
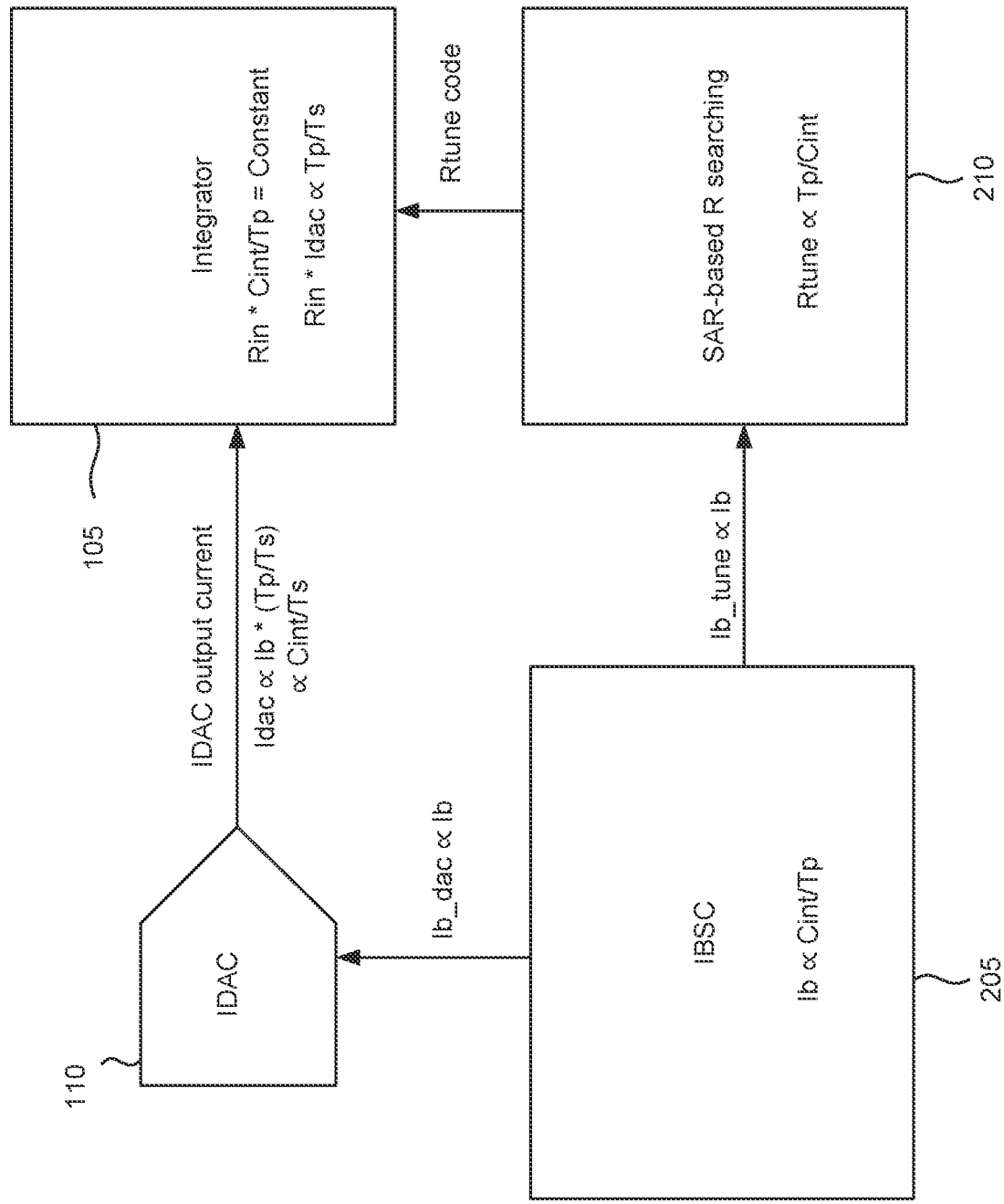
FIG. 2 is a high-level diagram of a switched-capacitor circuit and a SAR-based tuning circuit for the tuning of a time constant in an initial continuous-time integration stage in accordance with an aspect of the disclosure.

A high-level diagram of an example IBSC circuit 205, an RC tuning circuit 210, the IDAC 110, and the continuous-time integrator 105 are shown in FIG. 2. To provide an improved NTF and STF, the IBSC circuit 205 includes a replica capacitor (not illustrated in FIG. 2 but discussed further herein) that has a capacitance having a known proportionality a with respect to the capacitance Cint of the integration capacitor. The IBSC circuit 205 repeatedly charges and discharges the replica capacitor to a reference voltage Vref. The charging duration of the replica capacitor equals the pulse width Tp of a pair of complementary clock signals (not illustrated in FIG. 2) that clock the IBSC circuit 205. It can thus be shown that a resulting bias current Ib that charges the replica capacitor is proportional to the capacitance Cint of the integration capacitor divided by the pulse width Tp (Ib∝Cint/Tp). The bias current Ib is mirrored into a tuning current (Ib tune) that develops a tuning voltage Vtune across a variable tuning resistor (not illustrated in FIG. 2 but discussed further below) in an RC tuning circuit 210. The RC tuning circuit 210 adjusts a resistance of the variable tuning resistor using a successive-approximation register (SAR) based search to develop a tuning code for adjusting the resistance until the tuning voltage is approximately equal to the reference voltage.

The bias current Ib is also mirrored into an IDAC bias current (Ib_dac) that is proportional to the bias current. Because the IDAC output current is pulsed with respect to the pulse width Tp and the clocking period Ts, the final effective IDAC output current is proportional to the bias current times a ratio of the pulse width Tp and the clocking period Ts for the switching of the IBSC circuit 205. The effective IDAC bias current Idac is thus proportional to Cint/Ts (Idac∝Cint/Ts). As will be explained further herein, each active branch of the IDAC 110 mirrors the IDAC bias current. The number of active branches depends upon the digital output word from the quantizer (e.g., quantizer 115 of FIG. 1) that is being converted into a current by the IDAC 110. The IDAC 110 pulses an IDAC output current to the integrator 105 that is proportional to M*Idac, where M is the integer number of active branches in the IDAC.

An Rin tuning code (Rtune code) that is proportional (or equal) to the tuning code developed by the SAR-based search in the RC tuning circuit 210 tunes a resistance of the input resistor (Rin of FIG. 1) in the integrator 105. Given this tuning and the value of the IDAC output current, it can be shown that the factor Rin*Cint/Tp is advantageously maintained to substantially equal a constant across the process, voltage, and temperature corners for an ADC including the IBSC circuit 205, the IDAC 210, the integrator 105, and the RC tuning circuit 210. Similarly, the factor Rin*Idac is also maintained to substantially equal a constant across the process, voltage, and temperature corners.

Figure 3:
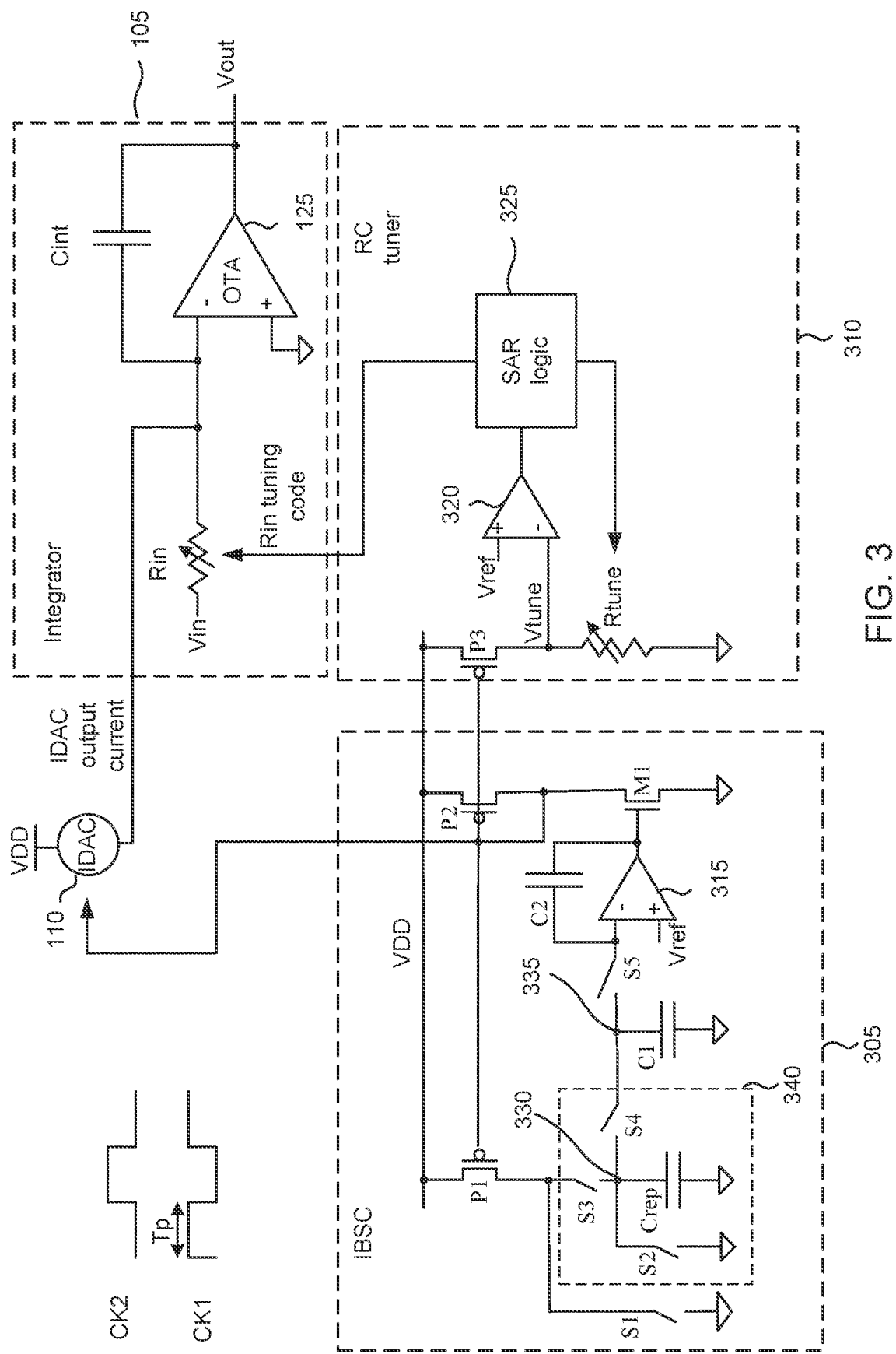
FIG. 3 is a circuit diagram of an example switched-capacitor circuit and a SAR-based tuning circuit for tuning the time constant of an initial continuous-time integration stage in accordance with an aspect of the disclosure.

A circuit diagram for an example IBSC circuit 305 and an example RC tuning circuit 310 is shown in FIG. 3. The IBSC circuit 305 includes a replica capacitor (Crep) that couples between a replica capacitor node 330 and ground. As implied by its name, the replica capacitor replicates the capacitance of the integration capacitor in the integrator 105 according to a proportionality constant α. A capacitance of the replica capacitor thus equals a product of the capacitance Cint of the integration capacitor and the proportionality constant α. The replica capacitor node 330 couples through a switch S4 to a holding capacitor node 335 and from the holding capacitor node 335 through a switch S5 to a first input terminal (for example, an inverting input terminal) of a differential amplifier 315 that receives a reference voltage Vref at a second input terminal (for example, a non-inverting terminal). Feedback through the differential amplifier 315 functions to maintain a voltage of the inverting input terminal to substantially equal the reference voltage. A holding capacitor C1 couples between the holding capacitor node 335 and ground to hold the reference voltage. Switch S5 couples between the holding capacitor node 335 and the inverting input terminal of the differential amplifier 315. Switch S5 closes when a clock signal CK2 is asserted to charge the holding capacitor C1 to the reference voltage and transfer excess charge to an integration capacitor C2 that couples between the inverting input terminal of the differential amplifier 315 and an output terminal of the differential amplifier 315. Switch S5 is also denoted herein as a first switch. The clock signal CK2 is a complement of a clock signal CK1 as shown separately in FIG. 3. Thus, when the clock signal CK1 is asserted, the switch S5 opens. The assertion duration of the clock signal CK1 is the integration pulse width Tp.

A switch S3 that is controlled by the clock signal CK1 couples between the replica capacitor node 330 and a drain of a p-type metal-oxide semiconductor (PMOS) transistor P1 having a source coupled to a power supply node for a power supply voltage VDD. The drain of the transistor P1 also couples through a switch S1 to ground. In addition, a switch S2 couples between the replica capacitor node 330 and ground. The clock signal CK2 controls switches S1, S2, and S5 whereas the clock signal CK1 controls switches S3 and S4. Thus, when the clock signal CK2 is asserted, switch S1 grounds the drain of transistor P1 whereas switch S2 grounds the replica capacitor. At the same time, the feedback through the differential amplifier 315 charges the holding capacitor to the reference voltage through the closed switch S5. Conversely, switches S1, S2, and S5 are opened when the clock signal CK1 is asserted whereas switches S3 and S4 is closed.

The combination of the differential amplifier 315 and capacitor C2 forms a switched-capacitor amplifier. Any voltage difference between the voltage stored by the holding capacitor C1 and the reference voltage Vref is thus transferred to the output terminal of the differential amplifier 315. The output terminal also couples to a gate of an n-type metal-oxide semiconductor (NMOS) transistor M1 having a source coupled to ground and a drain coupled to a drain of a diode-connected PMOS transistor P2 having a source coupled to the power supply node. Transistor M1 is also denoted herein as a first transistor. Transistor P2 is also denoted herein as a diode-connected second transistor. A gate of transistor P2 couples to a gate of transistor P1.

Transistor P1 is also denoted herein as a third transistor. Transistors P1 and P2 form a current mirror. When the clock signal CK1 is asserted, switches S3 and S4 are closed so that the transistor P1 conducts a bias current Ib into the replica capacitor to charge the replica capacitor for a period of Tp to reach the reference voltage. It can be shown that the combination of switches S2, S3, and S4 with the replica capacitor functions as a switched-capacitor resistor 340 having a resistance proportional to Tp/Cint (note that Ib*Tp=Crep*Vref). The bias current Ib conducted through the switched-capacitor resistor 340 is thus proportional to Vref/(Tp/Cint), which equals the factor Vref*Cint/Tp.

A gate of transistor P2 couples to a gate of a PMOS transistor P3 in the RC tuning circuit 310. Just like transistors P1 and P2, a source of transistor P3 couples to the power supply node such that transistor P3 is in a current mirror relationship with transistor P2. Depending upon a size ratio between transistors P2 and P3, transistor P3 conducts a mirrored current that is proportional to the bias current into a variable tuning resistor (Rtune) that couples to ground. As the mirrored current conducts through the variable tuning resistor, a tuning voltage Vtune develops across the variable tuning resistor. A node for the tuning voltage couples to an inverting input terminal of a comparator 320 that also has its non-inverting input terminal couple to a node for the reference voltage. A comparator output signal from the comparator 320 will thus have a binary state that depends upon whether the reference voltage is greater than or less than the tuning voltage. An output terminal of the comparator 320 couples to a SAR logic circuit 325 (which may be a finite state machine). Based upon the comparator output signal, the SAR logic circuit 325 performs a binary SAR-based resistance tuning on the tuning resistor until the tuning voltage is substantially equal to the reference voltage. An Rin tuning code that adjusts a resistance of an adjustable input resistor (Rin) in the integrator 105 may be proportional to or equal to the tuning code for the tuning resistor depending upon the relative resistances of the input resistor and the tuning resistor. The bias current from the IBSC circuit 305 is also mirrored by each active branch in the IDAC 110.

Figure 4:
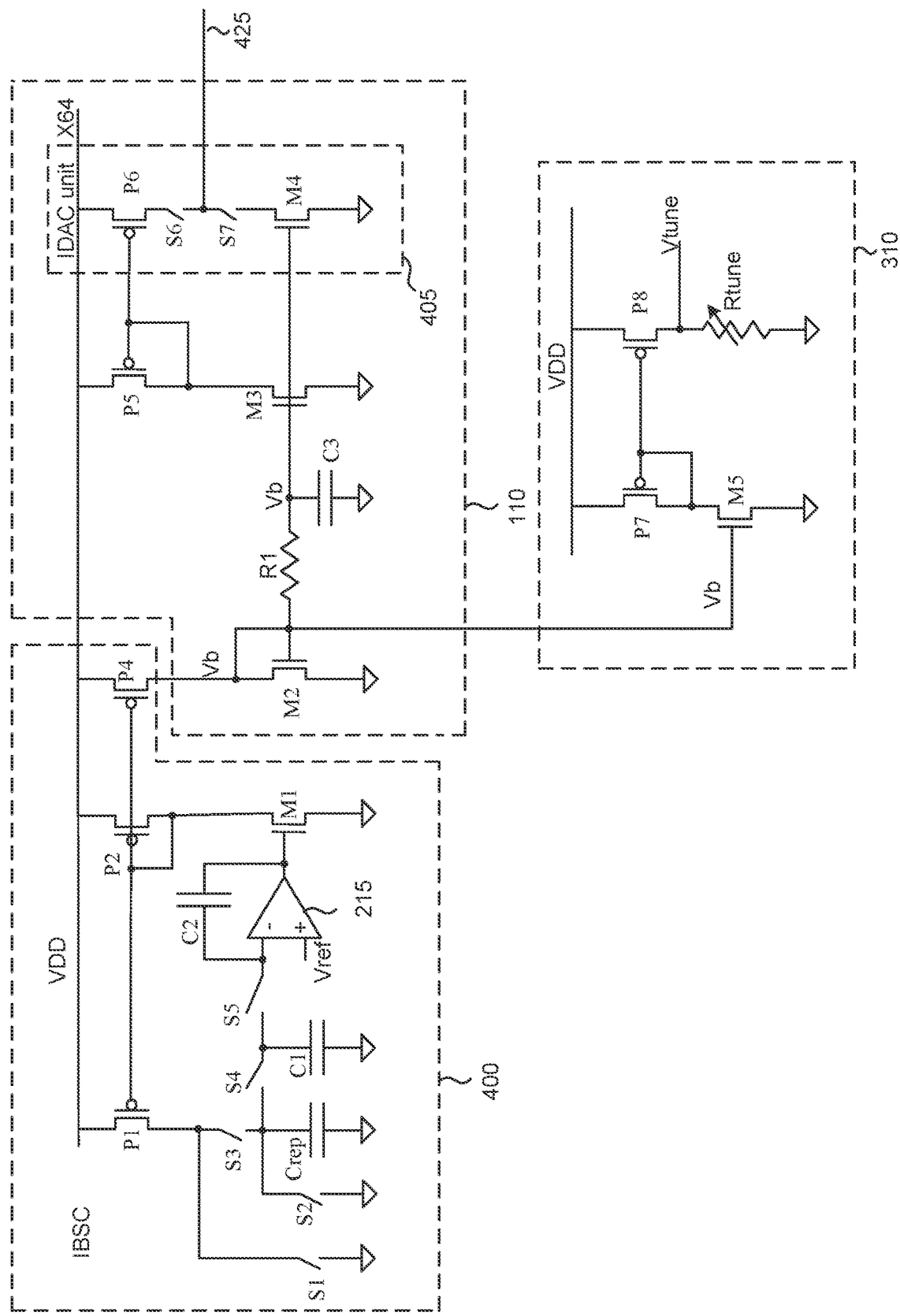
FIG. 4 is a circuit diagram illustrating an example current mirroring between a switched-capacitor circuit, a SAR-based tuning circuit, and an IDAC in accordance with an aspect of the disclosure.

The current mirroring in the IDAC 110 and the RC tuning circuit 310 is shown in greater detail in FIG. 4. An IBSC circuit 400 is also shown in FIG. 4 for illustration clarity and is arranged as discussed for FIG. 3 except for the inclusion of a PMOS transistor P4 having a source coupled to ground and a gate coupled to the gate of transistor P2. Transistor P4 is thus in a current mirror relationship with transistor P2 and will mirror a version of the bias current Ib. The mirrored current conducted by transistor P4 is driven into a drain of a diode-connected NMOS transistor M2 in the IDAC 110. This mirrored current will eventually be mirrored by each active branch 405 in the IDAC 110. The number of active branches depends upon the resolution in the IDAC 405. In one implementation, there may be up to 64 active branches 405 but it will appreciated that a larger or smaller resolution may be used in alternative implementations. For illustration clarity, only one active branch 405 is shown in FIG. 4. A current-mirror NMOS transistor M3 and an NMOS transistor M4 both have their gate coupled to the gate of the diode-connected transistor M2 through a low-pass filter formed by a capacitor C3 and a resistor R1. Transistor M4 and the current-mirror transistor M3 will thus mirror the current conducted by the diode-connected transistor M2 but are isolated by the low-pass filter from coupling due to IDAC switching. The sources of transistor M2, the current-mirror transistor M3, and transistor M4 are all coupled to ground.

To complete the mirroring to the active branches 405, a drain of the current-mirror transistor M3 couples to a drain of a diode-connected PMOS transistor P5 having a source coupled to the power supply node. The active branch 405 includes a PMOS transistor P6 that has a source coupled to the power supply node and a gate coupled to a gate of transistor P5 such that transistors P5 and P6 form a current mirror. In addition, the gate of transistor M4 in the active branch 405 is coupled to a gate of the current-mirror transistor M3 and has a source coupled to ground. Transistor M4 is thus in a current mirror relationship with the current-mirror transistor M3. A drain of transistor M4 couples to an output node 425 of the IDAC 110 through a switch S7. Similarly, a drain of transistor P6 couples to the output node 425 through a switch S6. Switches S6 and S7 are controlled in a complementary fashion depending upon whether the IDAC output current is negative or positive. In this fashion, the IDAC output current at the output node 425 not only has a digital magnitude but also a polarity.

To mirror the bias current to the RC tuning circuit 310, the gate of transistor M2 couples to a gate of an NMOS transistor M5 having a source coupled to ground. Transistor M5 is thus in a current mirror relationship with transistor M2 and will conduct a mirrored version of the bias current. A drain of transistor M5 couples to a drain of a diode-connected PMOS transistor P7 having a source coupled to the power supply node. A gate of transistor P7 couples to a gate of a PMOS transistor P8 that also has a source coupled to the power supply node. Transistors P7 and P8 thus form a current mirror. A drain of transistor P8 couples through the variable tuning resistor (Rtune) to ground. The mirrored current conducted by transistor P8 will thus develop the tuning voltage Vtune across the tuning resistor. A remainder of the RC tuning circuit 310 is as discussed with respect to FIG. 3 and is not shown in FIG. 4 for illustration clarity.

Referring again to FIG. 3, note that the comparator 320 that compares the reference voltage to the tuning voltage Vtune will inherently have an offset voltage. Due to this offset voltage, an output signal of the comparator 320 will not properly transition when the tuning voltage rises to be greater than or equal to the reference voltage. This offset voltage directly affects the tuning accuracy by the RC tuning circuit 310. One way to address the comparator offset voltage would be to increase a size of a differential pair of transistors (not illustrated) in the comparator 320. But then the enlarged differential pair of transistors occupy a relatively large amount of die space on the semiconductor die on which the comparator 320 is integrated. Alternatively, an additional amplifier (not illustrated) may be used to amplify the offset voltage so that it may be stored on an offset capacitor (not illustrated). But this additional amplifier and offset capacitor requires additional die space. In addition, the amplifier increases the power consumption.

A relatively low-power and compact solution that addresses the offset voltage of the comparator 320 is disclosed herein that does not suffer from the problems of a traditional offset voltage cancellation. To do so, the SAR logic circuit 325 is exploited to not only perform the binary SAR-based search to tune the resistance of the variable tuning resistor but also to calibrate the offset voltage of the comparator 320. The binary SAR-based search to tune the resistance of the variable tuning resistor is synchronous in that it is based upon cycles of a SAR clock signal. But a binary SAR-based search to effectively eliminate the offset voltage of the comparator 320 may be asynchronous in that it may be performed in a single clock cycle prior to the synchronous tuning of the tuning resistor.

Figure 5:
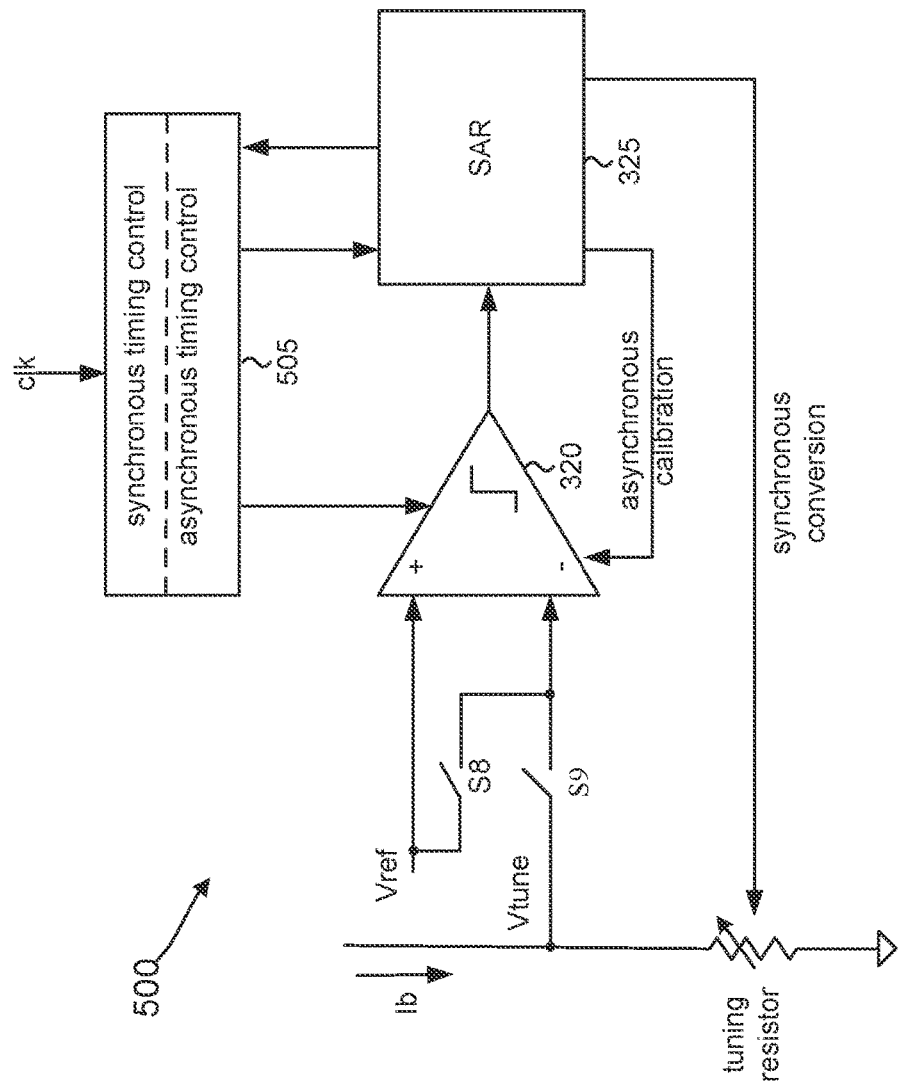
FIG. 5 is a diagram of a SAR-based tuning circuit in which a SAR state machine controls the calibration of a comparator with respect to an offset voltage of the comparator in accordance with an aspect of the disclosure.

The asynchronous SAR-based offset voltage calibration may be better appreciated with reference to an RC tuning circuit 500 shown FIG. 5. A mirrored version of the bias current Ib conducts through the variable tuning resistor to develop the tuning voltage (Vtune). As discussed with respect to FIG. 3, the comparator 320 functions to compare the reference voltage (Vref) to the tuning voltage. Based upon this comparison, the comparator 320 drives a binary output signal to the SAR logic circuit 325 (for example, a SAR-based finite state machine). A timing controller 505 controls the timing of the synchronous tuning of the variable tuning resistor as well as the asynchronous offset voltage calibration of the comparator 320. During the SAR-based tuning or conversion of the resistance of the variable tuning resistor, the SAR logic circuit 325 adjusts the resistance synchronous with respect to cycles of a clock signal (clk). During the synchronous tuning of the variable tuning resistor, a switch S8 that couples between the input terminals of the comparator 320 is open whereas a switch S9 that couples between a node for the tuning voltage and the inverting input terminal of the comparator 320 is open. In this fashion, the non-inverting input terminal of the comparator 320 receives the reference voltage whereas the inverting input terminal receives the tuning voltage during the synchronous operation. Note that this convention may be reversed in alternative implementations such that it would be the inverting input terminal that would receive the reference voltage whereas the non-inverting input terminal would receive the tuning voltage. But during the asynchronous tuning of the offset voltage of the comparator 320 by the SAR logic circuit 325, switch S9 is opened and switch S8 is closed such that the reference voltage drives both of the input terminals to the comparator 320. This asynchronous tuning may occur in a single cycle of the clock signal prior to the synchronous SAR-based tuning of the tuning resistor.

Figure 6:
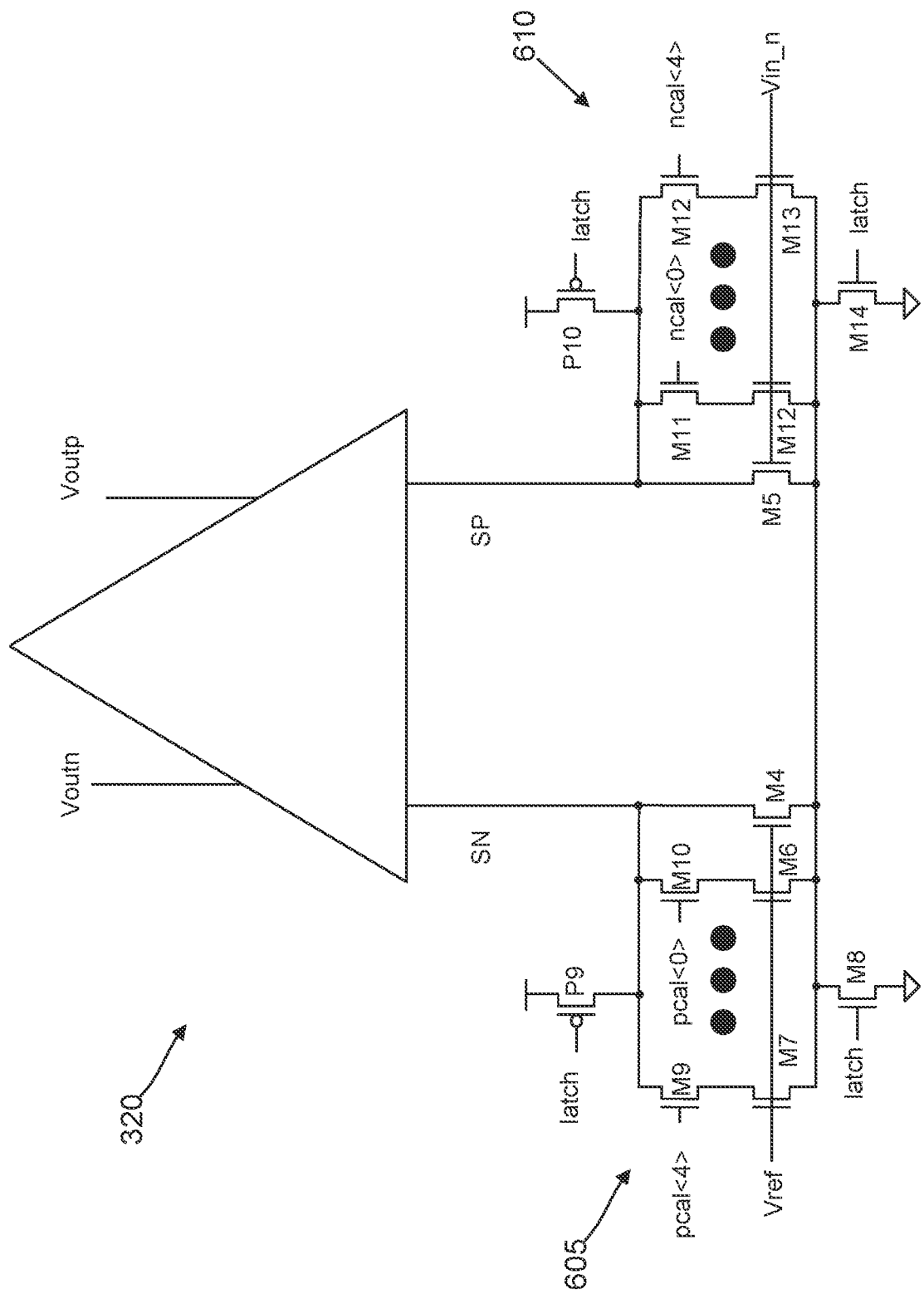
FIG. 6 is a circuit diagram of an example comparator that may be calibrated by a SAR-based calibration in accordance with an aspect of the disclosure.

There are a variety of architectures that may be used for comparator 320 to accommodate the binary tuning that results from the binary search and control by the SAR logic circuit 325. For example, the comparator 325 may include a major input pair of NMOS transistors M4 and M5 and a binary-weighted input pair of transistor arrays as shown in FIG. 6. The binary weighted input pair of transistor arrays are used to tune the offset mainly generated by the major input pair. The number of transistors in each transistor array depends upon the desired resolution or tuning range. In one implementation, each transistor array includes five binary-weighted transistors to cover a sixteen-to-one tuning range. However, it will be appreciated that other tuning ranges may be used in alternative implementations. A first array 605 of transistors includes a plurality of binary-weighted transistors starting with an NMOS transistor M6 that is one-sixteenth the size of an NMOS transistor M7. The binary-weighted transistors in the array 605 would include a transistor that is twice the size of the transistor M6, a transistor that is four times the size of transistor M6, and a transistor that is eight times the size of transistor M6. These additional transistors are not shown for illustration clarity. The reference voltage Vref drives the gates of the binary-weighted transistors. The sources of the binary-weighted transistors couple to ground through an NMOS transistor M8 controlled by a latch signal that is cycled during the asynchronous calibration. To respond to the digital control from the SAR-based tuning, the drains of each of the binary-weighted transistors couple to a negative internal node SN of the comparator 320 through a corresponding digitally-controlled transistor. A positive calibration tuning word (pcal) controls the digitally-controlled transistors in the array 605. For example, a zeroth bit (pcal<0>) of the positive calibration word controls a gate of an NMOS transistor M10 having a source coupled to the drain of transistor M6 and having a drain coupled to the negative internal node SN. Similarly, a fourth bit (pcal<4>) of the positive calibration word controls a gate of an NMOS transistor M9 having a source coupled to the drain of transistor M7 and having a drain coupled to the negative internal node SN. The negative internal node SN also couples to the power supply node through a PMOS transistor P9 controlled by the latch signal which is used to reset the internal node SN before each comparison starts.

An array 610 that couples to a positive internal node SP of the comparator 320 is analogous to the array 605. The number of transistors in the array 610 thus depends upon the desired resolution or tuning range. In one implementation, array 610 includes five binary-weighted transistors to cover a sixteen-to-one tuning range. An NMOS transistor M12 in the array 610 is one-sixteenth the size of an NMOS transistor M13. The binary-weighted transistors in array 610 would also include a transistor that is twice the size of the transistor M12, a transistor that is four times the size of transistor M12, and a transistor that is eight times the size of transistor M12. These additional binary-weighted transistors are not shown for illustration clarity. A negative input voltage Vin_n drives the gates of these binary-weighted transistors. This negative input voltage may equal the reference voltage during the asynchronous calibration of the comparator 320 and may equal the tuning voltage during the synchronous calibration of the tuning resistor. The sources of the binary-weighted transistors in array 610 couple to ground through an NMOS transistor M14 controlled by the latch signal. To respond to the digital SAR-based tuning, the drains of each of the binary-weighted transistors couple to the positive internal node SP through a corresponding digitally-controlled transistor. A negative calibration tuning word (ncal) controls the digitally-controlled transistors in array 610. For example, a zeroth bit (ncal<0>) of the negative calibration word controls a gate of an NMOS transistor M11 having a source coupled to the drain of transistor M12 and having a drain coupled to the positive internal node SP. Similarly, a fourth bit (ncal<4>) of the negative calibration word controls a gate of an NMOS transistor M12 having a source coupled to the drain of transistor M13 and having a drain coupled to the positive internal node SP. The positive internal node SP also couples to the power supply node through a PMOS transistor P10 controlled by the latch signal.

Figure 7:
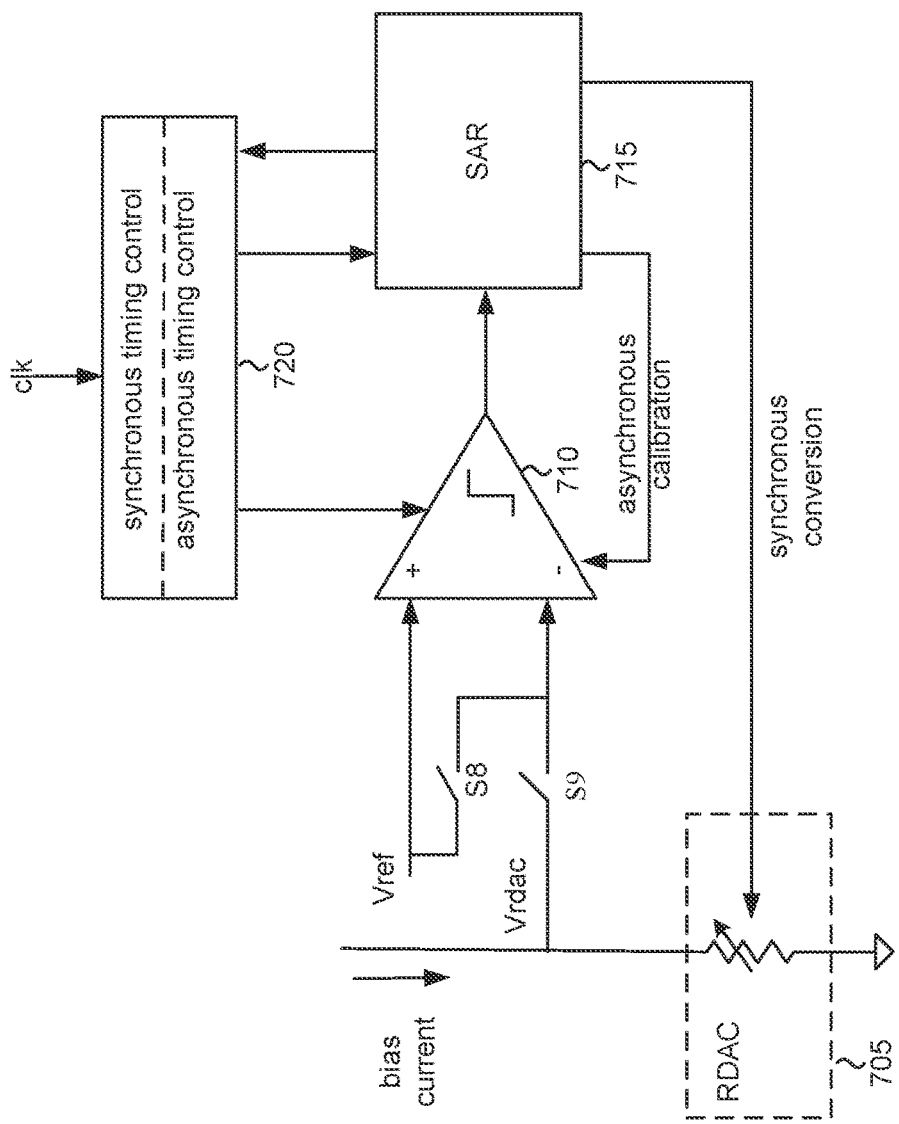
FIG. 7 is a circuit diagram of an RDAC that is adjusted responsive to a combination of a comparator and a SAR-based state machine and in which the SAR-based state machine also calibrates an offset voltage of the comparator in accordance with an aspect of the disclosure.

Depending upon whether the offset voltage is negative or positive, the SAR logic circuit 715 (FIG. 7) toggles either the positive calibration word or the negative calibration word to tune out or calibrate the effects of the offset voltage for comparator 320. It will be appreciated that there are other binary-weighted architectures that may be used in the comparator 320 to respond to a SAR-based tuning. For example, comparator 320 could include an input array of binary-weighted current sources in an alternative implementation. Note that the asynchronous calibration of the offset voltage of a comparator may be used in any system that includes a SAR logic circuit. For example, a resistor digital-to-analog converter (RDAC) 705 may have its resistance synchronously adjusted as by a SAR logic circuit 715 as shown in FIG. 7. A bias current conducts through the RDAC 705 to develop a RDAC voltage (Vrdac) that is compared by a comparator 710 to a reference voltage Vref. Switches S8 and S9 are arranged and operated as discussed with respect to FIG. 5. Thus, switch S8 is open during the synchronous tuning of the RDAC 705 as timed by a timing control circuit 720. The timing control circuit 720 also controls the asynchronous calibration of the comparator 710 to address its offset voltage. During the asynchronous calibration, switch S9 is opened and switch S8 is closed as discussed with respect to FIG. 5.

Figure 8:
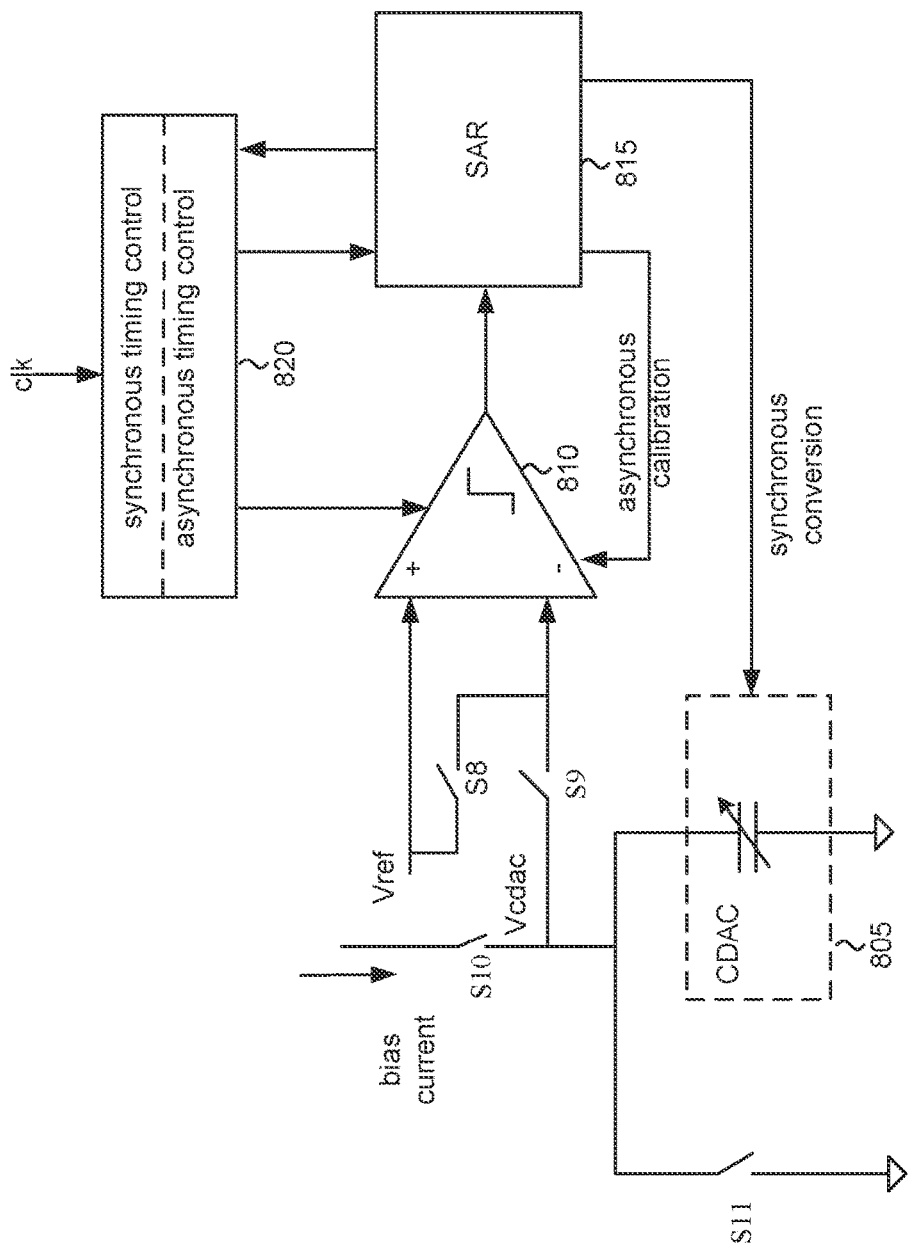
FIG. 8 is a circuit diagram of a CDAC that is adjusted responsive to a combination of a comparator and a SAR-based state machine and in which the SAR-based state machine also calibrates an offset voltage of the comparator in accordance with an aspect of the disclosure.

In another alternative implementation, a capacitor digital-to-analog converter (CDAC) 805 may have its capacitance synchronously adjusted as by a SAR logic circuit 815 as shown in FIG. 8. During a charging phase, a switch S10 closes so that a bias current conducts through the CDAC 805 to develop a CDAC voltage (Vcdac) that is compared by a comparator 810 to a reference voltage (Vref). A switch S11 that couples between switch S10 and ground is open during the charging phase. During a discharging phase, switch S10 opens and switch S11 closes to discharge the CDAC 805. Switches S8 and S9 are arranged and operated as discussed with respect to FIG. 5. Thus, switch S8 is open during the synchronous tuning of the CDAC 805 as timed by a timing control circuit 820. The timing control circuit 820 also controls the asynchronous calibration of the comparator 810 to address its offset voltage. During the asynchronous calibration, switch S9 is opened and switch S8 is closed as discussed with respect to FIG. 5.

Figure 9:
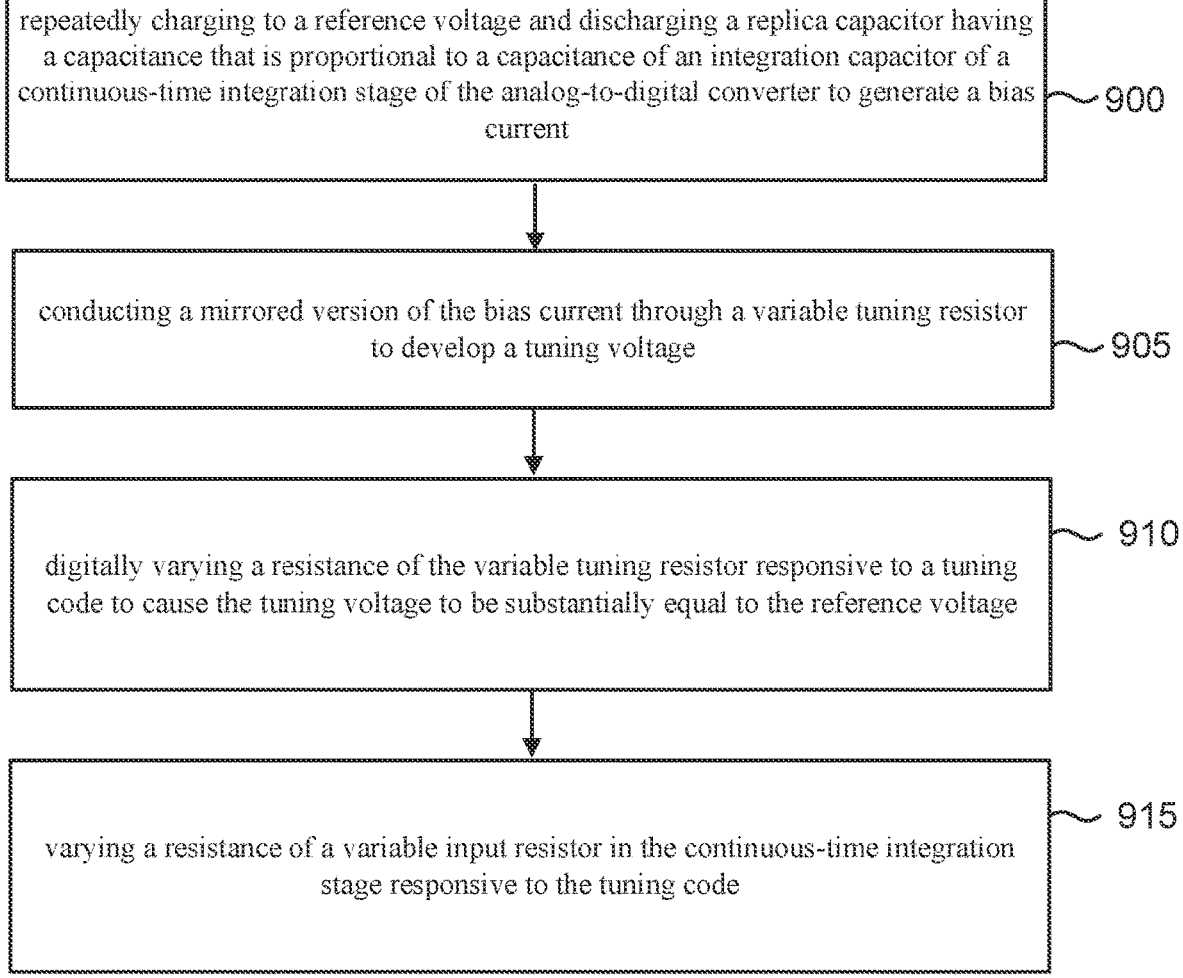
FIG. 9 is a flowchart of a method of adjusting a time constant of a continuous-time integration stage in an analog-to-digital converter in accordance with an aspect of the disclosure.

An example method of tuning an analog-to-digital converter will now be discussed with reference to the flowchart of FIG. 9. The method includes an act 900 of repeatedly charging to a reference voltage and discharging a replica capacitor having a capacitance that is proportional to a capacitance of an integration capacitor of a continuous-time integration stage of the analog-to-digital converter to generate a bias current. The repeated charging and discharging of the replica capacitor in the IBSC circuits 305 and 400 is an example of act 900. The method also includes an act 905 of conducting a mirrored version of the bias current through a variable tuning resistor to develop a tuning voltage. The development of the tuning voltage in the RC tuning circuit 310 is an example of act 905. In addition, the method includes an act 910 of digitally varying a resistance of the variable tuning resistor responsive to a tuning code to cause the tuning voltage to be substantially equal to the reference voltage. The SAR-based adjusting of the variable tuning resistor in the RC tuning circuit 310 is an example of act 910. Finally, the method includes an act 915 of varying a resistance of a variable input resistor in the continuous-time integration stage responsive to the tuning code. The tuning of the variable input resistor in the integrator 105 is an example of act 915.

Figure 10:
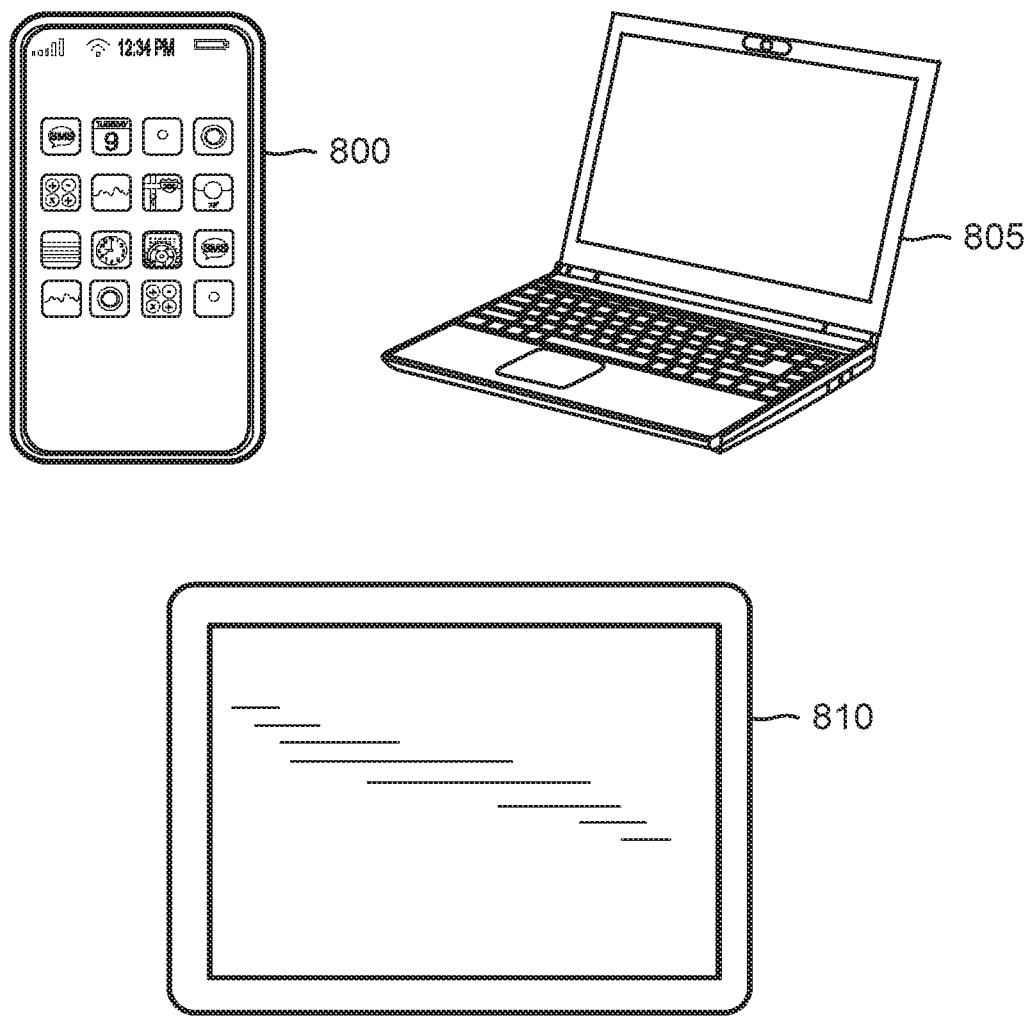
FIG. 10 illustrates some example electronic systems including a microphone generating an audio signal that is converted by an analog-to-digital converter having a time constant tuned in accordance with an aspect of the disclosure.

An analog-to-digital converter with the time constant tuning disclosed herein may be incorporated in a wide variety of electronic systems. For example, as shown in FIG. 10, a cellular telephone 1000, a laptop computer 1005, and a tablet PC 1010 may all include an analog-to-digital converter that functions to process an audio signal from a microphone in accordance with the disclosure. Other exemplary electronic systems such as an earbud, a music player, a video player, a communication device, and a personal computer may also be configured with an analog-to-digital converter constructed in accordance with the disclosure.

The disclosure will now be summarized through the following example clauses:

Clause 1. An analog-to-digital converter comprising:
    an integrator including a variable input resistor and an integration capacitor;
    a switched-capacitor bias current generator configured to be clocked by a pair of complementary clock signals to generate a bias current that is proportional to a capacitance of the integration capacitor divided by a pulse width of the complementary clock signals;
a current digital-to-analog converter (IDAC) configured to convert a digital output signal from the analog-to-digital converter into an IDAC output current for the integrator that is proportional to the bias current; and
a tuning circuit including a variable tuning resistor configured to conduct a mirrored version of the bias current to develop a tuning voltage across the variable tuning resistor, the tuning circuit further including a successive-approximation-register logic circuit configured to vary a resistance of the variable tuning resistor responsive to a tuning code, wherein the integrator is configured to vary a resistance of the variable input resistor responsive to the tuning code.

Clause 2. The analog-to-digital converter of clause 1, wherein the switched-capacitor bias current generator comprises:
a switched-capacitor resistor including a replica capacitor having a capacitance that is proportional to the capacitance of the integration capacitor, and wherein the switched-capacitor resistor is configured to have a resistance that is proportional to the pulse width divided by the capacitance of the replica capacitor.

Clause 3. The analog-to-digital converter of clause 2, wherein replica capacitor is coupled between a replica capacitor node and ground, and wherein the switched-capacitor bias current generator further comprises:
a holding capacitor coupled between a holding capacitor node and ground;
a differential amplifier having a first input terminal coupled to a node for a reference voltage;
a first switch coupled between the switched-capacitor resistor and a second input terminal of the differential amplifier;
a first transistor having a gate coupled to an output terminal of the differential amplifier and having a source coupled to ground;
and a current mirror configured to mirror a current conducted by the first transistor into the bias current.

Clause 4. The analog-to-digital converter of clause 3, wherein the first input terminal is a non-inverting terminal and the second input terminal is an inverting input terminal.

Clause 5. The analog-to-digital converter of any of clauses 3-4, wherein the first transistor comprises an n-type metal-oxide semiconductor (NMOS) transistor, and wherein the current mirror comprises:
a diode-connected second transistor having a source coupled to a power supply node for a power supply voltage and having a drain coupled to a drain of the first transistor; and
a third transistor having a source coupled to the power supply node, a gate coupled to a gate of the diode-connected second transistor, and a drain coupled to the switched-capacitor resistor.

Clause 6. The analog-to-digital converter of any of clauses 1-5, wherein the tuning circuit further includes:
a comparator having an output terminal coupled to the successive-approximation-register logic circuit, a first input terminal coupled to a node for the tuning voltage, and a second input terminal coupled to a node for a reference voltage.

Clause 7. The analog-to-digital converter of clause 6, wherein the successive-approximation-register logic circuit is further configured to calibrate the comparator to reduce an effect of an offset voltage of the comparator.

Clause 8. The analog-to-digital converter of clause 7, wherein the successive-approximation-register logic circuit is further configured to vary the resistance of the variable tuning resistor synchronously with respect to a clock signal and configured to calibrate the comparator asynchronously with respect to the clock signal.

Clause 9. The analog-to-digital converter of any of clauses 1-8, further comprising: a quantizer configured to provide the digital output signal from the analog-to-digital converter.

Clause 10. The analog-to-digital converter of clause 9, wherein the integrator is a first-stage integrator, the analog-to-digital converter further comprising:
a discrete-time integrator configured to integrate an output signal from the first-stage integrator to provide an integrated signal, wherein the quantizer is further configured to quantize the integrated signal to provide the digital output signal.

Clause 11. The analog-to-digital converter of any of clauses 9-10, wherein the quantizer is a successive-approximation-register-based quantizer, and wherein the analog-to-digital converter is a sigma-delta analog-to-digital converter.

Clause 12. The analog-to-digital converter of any of clauses 1-11, wherein the analog-to-digital converter is configured to digitize an audio signal from a microphone.

Clause 13. The analog-to-digital converter of any of clauses 1-12, wherein the analog-to-digital converter is included within a cellular telephone.

Clause 14. A method of tuning an analog-to-digital converter, comprising:
repeatedly charging to a reference voltage and discharging a replica capacitor having a capacitance that is proportional to a capacitance of an integration capacitor of a continuous-time integration stage of the analog-to-digital converter to generate a bias current;
conducting a mirrored version of the bias current through a variable tuning resistor to develop a tuning voltage;
digitally varying a resistance of the variable tuning resistor responsive to a tuning code to cause the tuning voltage to be substantially equal to the reference voltage; and
varying a resistance of a variable input resistor in the continuous-time integration stage responsive to the tuning code.

Clause 15. The method of clause 14, further comprising:
converting a digital output signal from the analog-to-digital converter through a current digital-to-analog converter (IDAC) into an IDAC output current that is proportional to the bias current; and
driving an input terminal of a differential amplifier in the continuous-time integration stage with the IDAC output current.

Clause 16. The method of any of clauses 14-15, further comprising:
comparing the tuning voltage to the reference voltage in a comparator to generate a comparator output signal; and
generating the tuning code in a successive-approximation-register state machine responsive to the comparator output signal.

Clause 17. The method of clause 16, wherein generating the tuning code in the successive-approximation-register state machine is synchronous with a clock signal, the method further comprising:
using the successive-approximation-register state machine to calibrate the comparator with respect to an offset voltage of the comparator, wherein a calibration of the comparator is asynchronous with respect to the clock signal.

Clause 18. An analog-to-digital converter, comprising:
a continuous-time integrator including a variable input resistor coupled to an input terminal of a differential amplifier and including an integration capacitor coupled between the input terminal of the differential amplifier and an output terminal of the differential amplifier;
a switched-capacitor circuit configured to generate a bias current that is proportional to a capacitance of the integration capacitor; and
a tuning circuit configured to digitally adjust a resistance of a variable resistor according to a tuning code so that a product of the resistance and the bias current equals a reference voltage, wherein the continuous-time integrator is configured to adjust a resistance of the variable input resistor responsive to the tuning code.

Clause 19. The analog-to-digital converter of clause 18, further comprising:
a current-digital-to-analog converter (IDAC) configured to convert a digital output signal from the analog-to-digital converter into an IDAC current that is proportional to the bias current.

Clause 20. The analog-to-digital converter of any of clauses 18-19, wherein the tuning circuit includes a successive-approximation-register state machine configured to digitally adjust the resistance of the variable tuning resistor.

As those of some skill in this art will by now appreciate and depending on the particular application at hand, many modifications, substitutions and variations can be made in and to the materials, apparatus, configurations and methods of use of the devices of the present disclosure without departing from the scope thereof as defined by the appended claims. In light of this, the scope of the present disclosure should not be limited to that of the particular implementations illustrated and described herein, as they are merely by way of some examples thereof, but rather, should be fully commensurate with that of the claims appended hereafter and their functional equivalents.

What is claimed is:

1. An analog-to-digital converter comprising:
an integrator including a variable input resistor and an integration capacitor;
a switched-capacitor bias current generator configured to be clocked by a pair of complementary clock signals to generate a bias current that is proportional to a capacitance of the integration capacitor divided by a pulse width of the complementary clock signals;
a current digital-to-analog converter (IDAC) configured to convert a digital output signal from the analog-to-digital converter into an IDAC output current for the integrator that is proportional to the bias current; and
a tuning circuit including a variable tuning resistor configured to conduct a mirrored version of the bias current to develop a tuning voltage across the variable tuning resistor, the tuning circuit further including a successive-approximation-register logic circuit configured to vary a resistance of the variable tuning resistor responsive to a tuning code, wherein the integrator is configured to vary a resistance of the variable input resistor responsive to the tuning code.

2. The analog-to-digital converter of claim 1, wherein the switched-capacitor bias current generator comprises:
a switched-capacitor resistor including a replica capacitor having a capacitance that is proportional to the capacitance of the integration capacitor, and wherein the switched-capacitor resistor is configured to have a resistance that is proportional to the pulse width divided by the capacitance of the replica capacitor.

3. The analog-to-digital converter of claim 2, wherein replica capacitor is coupled between a replica capacitor node and ground, and wherein the switched-capacitor bias current generator further comprises:
a holding capacitor coupled between a holding capacitor node and ground;
a differential amplifier having a first input terminal coupled to a node for a reference voltage;
a first switch coupled between the switched-capacitor resistor and a second input terminal of the differential amplifier;
a first transistor having a gate coupled to an output terminal of the differential amplifier and having a source coupled to ground;
and a current mirror configured to mirror a current conducted by the first transistor into the bias current.

4. The analog-to-digital converter of claim 3, wherein the first input terminal is a non-inverting terminal and the second input terminal is an inverting input terminal.

5. The analog-to-digital converter of claim 3, wherein the first transistor comprises an n-type metal-oxide semiconductor (NMOS) transistor, and wherein the current mirror comprises:
a diode-connected second transistor having a source coupled to a power supply node for a power supply voltage and having a drain coupled to a drain of the first transistor; and
a third transistor having a source coupled to the power supply node, a gate coupled to a gate of the diode-connected second transistor, and a drain coupled to the switched-capacitor resistor.

6. The analog-to-digital converter of claim 1, wherein the tuning circuit further includes:
a comparator having an output terminal coupled to the successive-approximation-register logic circuit, a first input terminal coupled to a node for the tuning voltage, and a second input terminal coupled to a node for a reference voltage.

7. The analog-to-digital converter of claim 6, wherein the successive-approximation-register logic circuit is further configured to calibrate the comparator to reduce an effect of an offset voltage of the comparator.

8. The analog-to-digital converter of claim 7, wherein the successive-approximation-register logic circuit is further configured to vary the resistance of the variable tuning resistor synchronously with respect to a clock signal and configured to calibrate the comparator asynchronously with respect to the clock signal.

9. The analog-to-digital converter of claim 1, further comprising:
a quantizer configured to provide the digital output signal from the analog-to-digital converter.

10. The analog-to-digital converter of claim 9, wherein the integrator is a first-stage integrator, the analog-to-digital converter further comprising:
a discrete-time integrator configured to integrate an output signal from the first-stage integrator to provide an integrated signal, wherein the quantizer is further configured to quantize the integrated signal to provide the digital output signal.

11. The analog-to-digital converter of claim 9, wherein the quantizer is a successive-approximation-register-based quantizer, and wherein the analog-to-digital converter is a sigma-delta analog-to-digital converter.

12. The analog-to-digital converter of claim 1, wherein the analog-to-digital converter is configured to digitize an audio signal from a microphone.

13. The analog-to-digital converter of claim 12, wherein the analog-to-digital converter is included within a cellular telephone.

14. A method of tuning an analog-to-digital converter, comprising:
- repeatedly charging to a reference voltage and discharging a replica capacitor having a capacitance that is proportional to a capacitance of an integration capacitor of a continuous-time integration stage of the analog-to-digital converter to generate a bias current;
- conducting a mirrored version of the bias current through a variable tuning resistor to develop a tuning voltage;
- digitally varying a resistance of the variable tuning resistor responsive to a tuning code to cause the tuning voltage to be substantially equal to the reference voltage; and
- varying a resistance of a variable input resistor in the continuous-time integration stage responsive to the tuning code.

15. The method of claim 14, further comprising:
converting a digital output signal from the analog-to-digital converter through a current digital-to-analog converter (IDAC) into an IDAC output current that is proportional to the bias current; and
driving an input terminal of a differential amplifier in the continuous-time integration stage with the IDAC output current.

16. The method of claim 14, further comprising:
comparing the tuning voltage to the reference voltage in a comparator to generate a comparator output signal; and
generating the tuning code in a successive-approximation-register state machine responsive to the comparator output signal.

17. The method of claim 16, wherein generating the tuning code in the successive-approximation-register state machine is synchronous with a clock signal, the method further comprising:
using the successive-approximation-register state machine to calibrate the comparator with respect to an offset voltage of the comparator, wherein a calibration of the comparator is asynchronous with respect to the clock signal.

18. An analog-to-digital converter, comprising:
a continuous-time integrator including a variable input resistor coupled to an input terminal of a differential amplifier and including an integration capacitor coupled between the input terminal of the differential amplifier and an output terminal of the differential amplifier;
a switched-capacitor circuit configured to generate a bias current that is proportional to a capacitance of the integration capacitor; and
a tuning circuit configured to digitally adjust a resistance of a variable resistor according to a tuning code so that a product of the resistance and the bias current equals a reference voltage, wherein the continuous-time integrator is configured to adjust a resistance of the variable input resistor responsive to the tuning code.

19. The analog-to-digital converter of claim 18, further comprising:
a current-digital-to-analog converter (IDAC) configured to convert a digital output signal from the analog-to-digital converter into an IDAC current that is proportional to the bias current.

20. The analog-to-digital converter of claim 18, wherein the tuning circuit includes a successive-approximation-register state machine configured to digitally adjust the resistance of the variable tuning resistor.

* * * * *